United States Patent [19]
Takeuchi

[11] Patent Number: 6,074,787
[45] Date of Patent: Jun. 13, 2000

[54] METHOD OF MAKING MASK PATTERN UTILIZING AUXILIARY PATTERN FORBIDDEN REGION

[75] Inventor: Koichi Takeuchi, Kanagawa, Japan

[73] Assignee: Sony Corporation, Tokyo, Japan

[21] Appl. No.: 09/095,926

[22] Filed: Jun. 12, 1998

[30] Foreign Application Priority Data

Jun. 18, 1997 [JP] Japan ................................ P09-161627

[51] Int. Cl.⁷ ........................................................ G03F 9/00
[52] U.S. Cl. ................................................. 430/5; 430/296
[58] Field of Search ........................................ 439/5, 296

[56] References Cited

U.S. PATENT DOCUMENTS

| | | | |
|---|---|---|---|
| 5,229,230 | 7/1993 | Kamon | 430/5 |
| 5,585,210 | 12/1996 | Lee et al. | 430/5 |
| 5,849,437 | 12/1998 | Yamazaki et al. | 430/5 |
| 5,885,747 | 3/1999 | Yamasaki et al. | 430/296 |
| 5,888,677 | 3/1999 | Nakae | 430/5 |

*Primary Examiner*—Christopher G. Young
*Assistant Examiner*—Saleha R. Mohamedulla
*Attorney, Agent, or Firm*—Ronald P. Kananen; Rader, Fishman & Grauer

[57] ABSTRACT

A mask pattern including an auxiliary pattern for improving printing accuracy is easily formed. A process of making the auxiliary pattern includes the steps of: providing an auxiliary pattern forbidden region around an original pattern based on the original pattern formed by an original pattern generating means (step S1); providing an auxiliary pattern formation region around the auxiliary pattern forbidden region based on the auxiliary pattern forbidden region provided in step S1 (step S2); and forming an auxiliary pattern of specific width based on the auxiliary pattern formation region provided in step S2 (step S3). Such formation of the auxiliary pattern prevents neighboring two traces of auxiliary pattern from touching or overlapping each other, for example. An auxiliary pattern is easily formed even if an original pattern is a complicated one without repeatability.

9 Claims, 14 Drawing Sheets

| secondary light source | depth of focus (μm) | |
|---|---|---|
| | denth pattern | sparse pattern |
| flat σ = 0.55 | 0.8 | 0.7 |
| flat σ = 0.80 | 1.2 | 0.7 |
| quadrupole | 1.5 | 0.7 |

METHOD OF MAKING MASK PATTERN UTILIZING AUXILIARY PATTERN FORBIDDEN REGION

BACKGROUND OF THE INVENTION

1. Field of the Invention

The present invention relates to a method of making a mask pattern for a mask used in manufacture of semiconductor integrated circuits and so on, an apparatus for making a mask pattern and an apparatus for making such a mask.

2. Description of the Related Art

Lithography techniques have been utilized in manufacturing semiconductor integrated circuits and so on, including the step of printing a mask pattern formed on a mask onto a wafer through the use of an exposure system such as a stepper (a step-and-repeat apparatus). It is desirable to increase depth of focus as much as possible for achieving accuracy in printing a mask pattern. The following methods are known for increasing depth of focus.

For example, a method of increasing a value of $\sigma$ of an exposure system and a method of oblique incidence illumination such as zone illumination are known for increasing depth of focus. Such methods are effective for a pattern 121, as shown in FIG. 1, having dense traces on a mask 110. However, with such methods an increase in depth of focus is not expected for a sparse (non-dense) pattern 131 as shown in FIG. 2.

A table in FIG. 3 shows depths of focus obtained with a dense mask pattern and a sparse mask pattern under different conditions of secondary light sources wherein a KrF excimer laser stepper is used as an exposure system. Depths of focus are obtained with secondary light sources of flat illumination where values of $\sigma$ are 0.55 and 0.80, respectively, and quadrupole illumination as oblique incidence illumination. As a dense pattern, the pattern 121 shown in FIG. 1 is used, made up of lines and spaces wherein trace width is 0.20 $\mu$m. As a sparse pattern, the pattern 131 shown in FIG. 2 is used, made up of single trace without any other neighboring trace wherein trace width is 0.20 $\mu$m.

As shown in FIG. 3, in the case of dense pattern, the depth of focus changes with the secondary light sources of the exposure system. The depth of focus increases with an increase in the value of $\sigma$ of flat illumination. Furthermore, the depth of focus is greater with oblique incidence illumination.

In the case of sparse pattern in contrast, the depth of focus does not change with the secondary light sources. Furthermore, the depth of focus is lower under any of the conditions compared to the dense pattern. It is thus impossible to increase depth of focus with changing an illumination condition for the sparse pattern. However, a method is known for increasing depth of focus with a sparse pattern through forming a pseudo dense pattern. The method utilizes the fact that depth of focus is increased with a dense pattern compared to a sparse pattern as described above.

FIG. 4 is a top view of a sparse mask pattern wherein a pseudo dense pattern is formed through the use of techniques of related art. In this example a sparse original pattern 141 of width w1 is formed on the mask 110. An auxiliary pattern 142 of width w2 is formed on both sides of the original pattern 141 at intervals 'd'. A pseudo dense pattern is thereby formed. Width w2 is required to be lower than the resolution limit of an exposure system used in a printing process so that the auxiliary pattern 142 is not printed on a wafer. The depth of focus of the sparse original pattern is thus increased without printing the auxiliary pattern 142 on the wafer.

FIG. 5 is a plot for showing a relationship between width w2 and resolution dimension of the auxiliary pattern 142 (a graph 151) and a relationship between width w2 and depth of focus of the sparse original pattern 141 (a graph 152) with regard to the pattern with the pseudo dense pattern as described above. The results shown are obtained through light intensity calculation wherein width w1 of the sparse original pattern 141 is 0.20 $\mu$m and interval 'd' between the original pattern 141 and the auxiliary pattern 142 is 0.20 $\mu$m.

As shown in the plot, the closer width w2 of the auxiliary pattern 142 to width w1 of the sparse original pattern 141, the more the depth of focus of the pattern 141 is increased.

However, a theory of auxiliary pattern formation method is not thoroughly established in related art. For example, if an original pattern is a simple repeated pattern, auxiliary pattern formation is relatively easy. However, if an original pattern is a non-repetitive and complex one such as a circuit pattern of semiconductor integrated circuit, formation of auxiliary pattern is complicated as well.

Auxiliary pattern formation has been empirically performed since a method thereof is not theoretically established. It therefore takes a long time for fabricating an auxiliary pattern all over the region on a mask, for example. Consequently auxiliary pattern formation is practically impossible in some cases.

SUMMARY OF THE INVENTION

It is an object of the invention to provide a method of making a mask pattern, an apparatus for making a mask pattern and an apparatus for making a mask in order to easily fabricate a mask pattern including an auxiliary mask for improving printing accuracy.

A method of making a mask pattern of the invention includes the steps of: forming an original pattern to be printed on a wafer substrate; providing a specific width on the periphery of the original pattern and enlarging the original pattern so as to form an enlarged original pattern region and establishing the enlarged original pattern region as an auxiliary pattern forbidden region wherein formation of the auxiliary pattern is forbidden; providing a specific width on the periphery of the auxiliary pattern forbidden region and enlarging the auxiliary pattern forbidden region so as to form an enlarged forbidden region and establishing the enlarged forbidden region from which the auxiliary pattern forbidden region is excluded as an auxiliary pattern formation region for forming the auxiliary pattern; and reducing the auxiliary pattern formation region to a specific width so as to form the auxiliary pattern.

An apparatus for making a mask pattern of the invention comprises: a means for forming an original pattern to be printed on a wafer substrate; a forbidden region establishing means for providing a specific width on the periphery of the original pattern and enlarging the original pattern so as to form an enlarged original pattern region and establishing the enlarged original pattern region as an auxiliary pattern forbidden region wherein formation of the auxiliary pattern is forbidden; a formation region establishing means for providing a specific width on the periphery of the auxiliary pattern forbidden region and enlarging the auxiliary pattern forbidden region so as to form an enlarged forbidden region and establishing the enlarged forbidden region from which the auxiliary pattern forbidden region is excluded as an auxiliary pattern formation region for forming the auxiliary pattern; and an auxiliary pattern formation means for reducing the auxiliary pattern formation region to a specific width so as to form the auxiliary pattern.

An apparatus for making a mask of the invention comprises: a means for forming an original pattern to be printed on a wafer substrate; a forbidden region establishing means for providing a specific width on the periphery of the original pattern and enlarging the original pattern so as to form an enlarged original pattern region and establishing the enlarged original pattern region as an auxiliary pattern forbidden region wherein formation of the auxiliary pattern is forbidden; a formation region establishing means for providing a specific width on the periphery of the auxiliary pattern forbidden region and enlarging the auxiliary pattern forbidden region so as to form an enlarged forbidden region and establishing the enlarged forbidden region from which the auxiliary pattern forbidden region is excluded as an auxiliary pattern formation region for forming the auxiliary pattern; an auxiliary pattern formation means for reducing the auxiliary pattern formation region to a specific width so as to form the auxiliary pattern; a means for transforming the mask pattern including the original pattern and the auxiliary pattern into specific drawing data; and a means for drawing the mask pattern on the mask substrate based on the drawing data.

In the method of making a mask pattern or the apparatus for making a mask pattern of the invention, before formation of the auxiliary pattern, the auxiliary pattern forbidden region is formed and the auxiliary pattern formation region for forming the auxiliary pattern is established on the periphery of the auxiliary pattern forbidden region. The auxiliary pattern formation region is then reduced to the specific width so as to form the auxiliary pattern. Such formation of the auxiliary pattern prevents neighboring two traces of the auxiliary pattern from touching or overlapping each other, for example. The auxiliary pattern is easily formed even if the original pattern is a complicated one without repeatability.

In the method of making a mask of the invention, before formation of the auxiliary pattern, the auxiliary pattern forbidden region is formed and the auxiliary pattern formation region for forming the auxiliary pattern is established on the periphery of the auxiliary pattern forbidden region. The auxiliary pattern formation region is then reduced to the specific width so as to form the auxiliary pattern. The mask pattern including the original pattern and the auxiliary pattern is transformed into the specific drawing data. The mask pattern is drawn on the mask substrate based on the drawing data. The mask pattern including the auxiliary pattern is thereby easily formed on the mask substrate. In a printing process onto a wafer, depth of focus of the original pattern is increased and printing accuracy of the original pattern is improved.

Other and further objects, features and advantages of the invention will appear more fully from the following description.

DETAILED DESCRIPTION OF THE PREFERRED EMBODIMENT

A preferred embodiment of the invention will now be described in detail with reference to the accompanying drawings.

Figure 1:
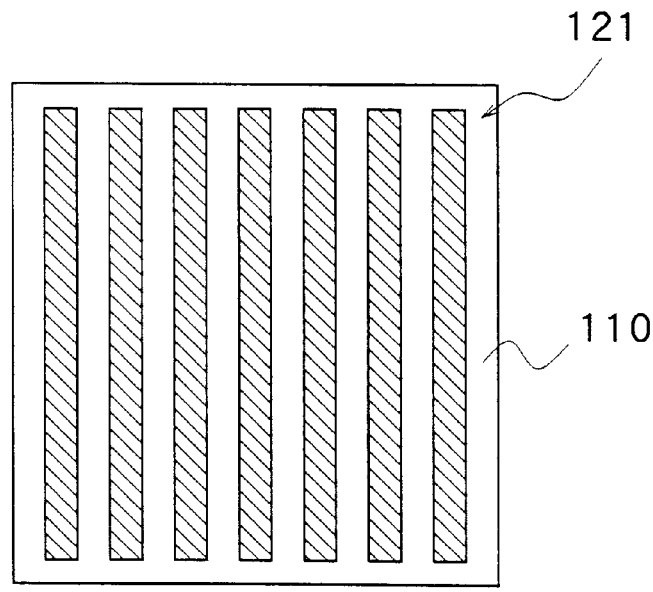
FIG. 1 is a top view of dense pattern of related art.
Figure 2:
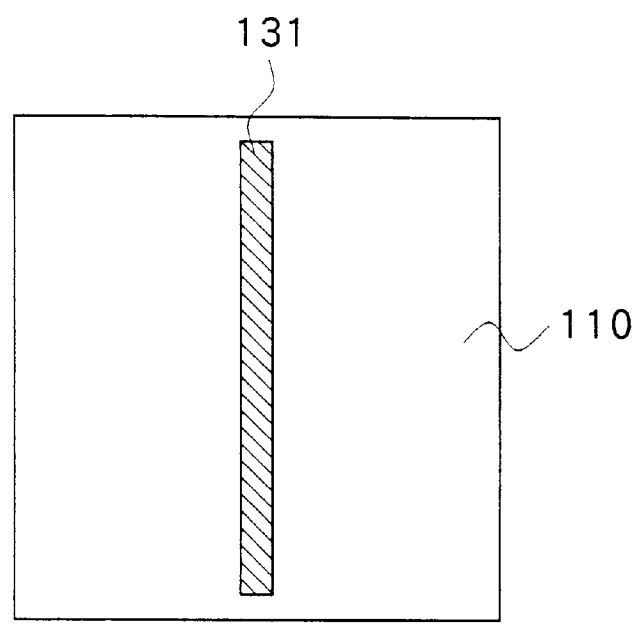
FIG. 2 is a top view of sparse pattern of related art.
Figures 3, 4:
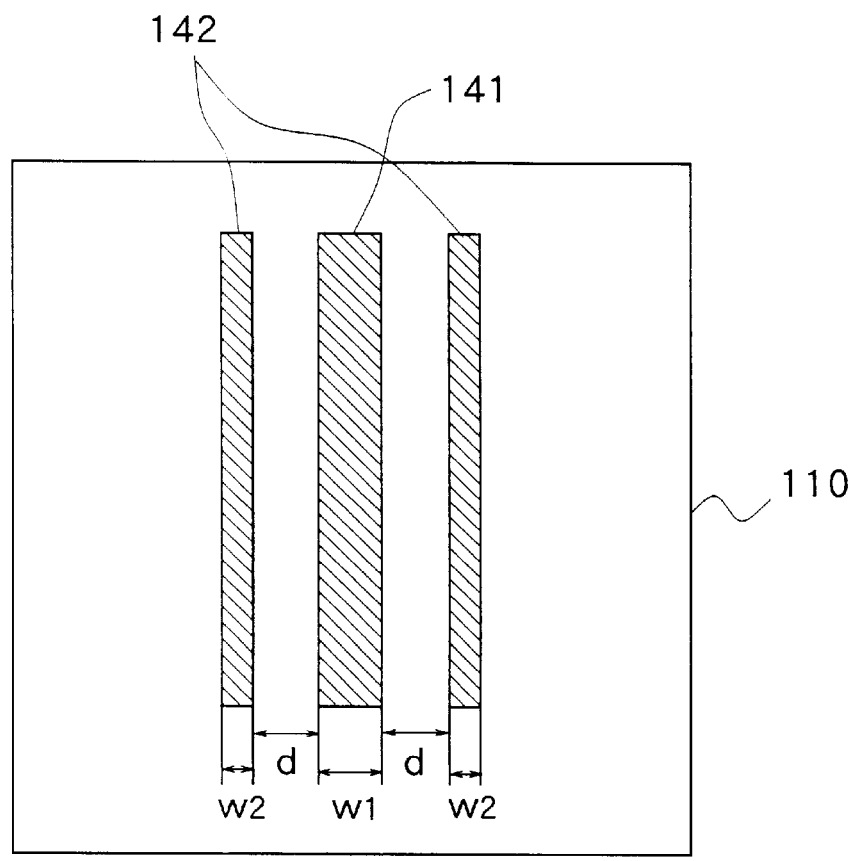
FIG. 3 is a table showing depths of focus obtained with the dense mask pattern and the sparse mask pattern under different conditions of secondary light sources.
FIG. 4 is a top view of a mask pattern including an auxiliary pattern of related art.
Figure 5:
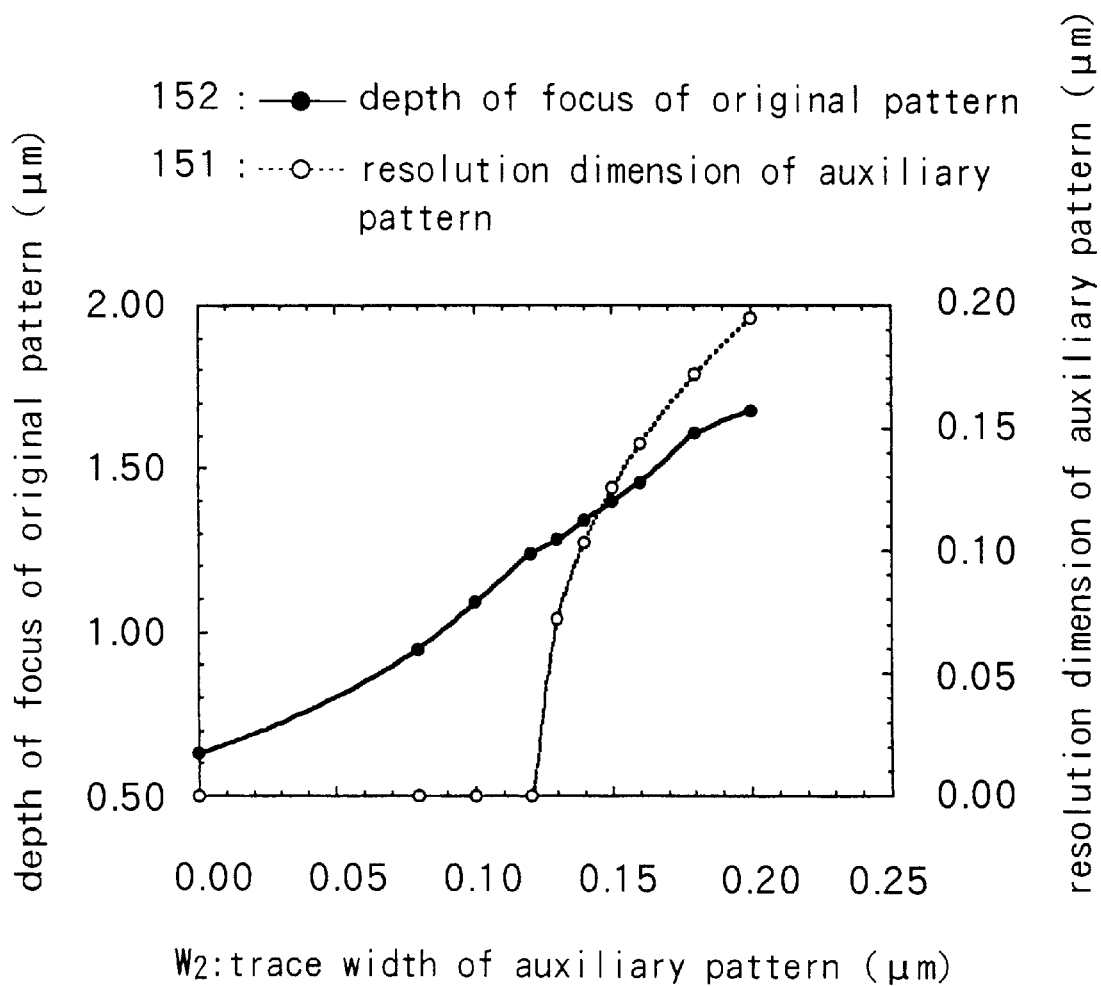
FIG. 5 is a plot for showing a relationship between the width and resolution dimension of the auxiliary pattern and a relationship between the width of the auxiliary pattern and depth of focus of the sparse original pattern with regard to the pattern with the pseudo dense pattern.
Figure 6:
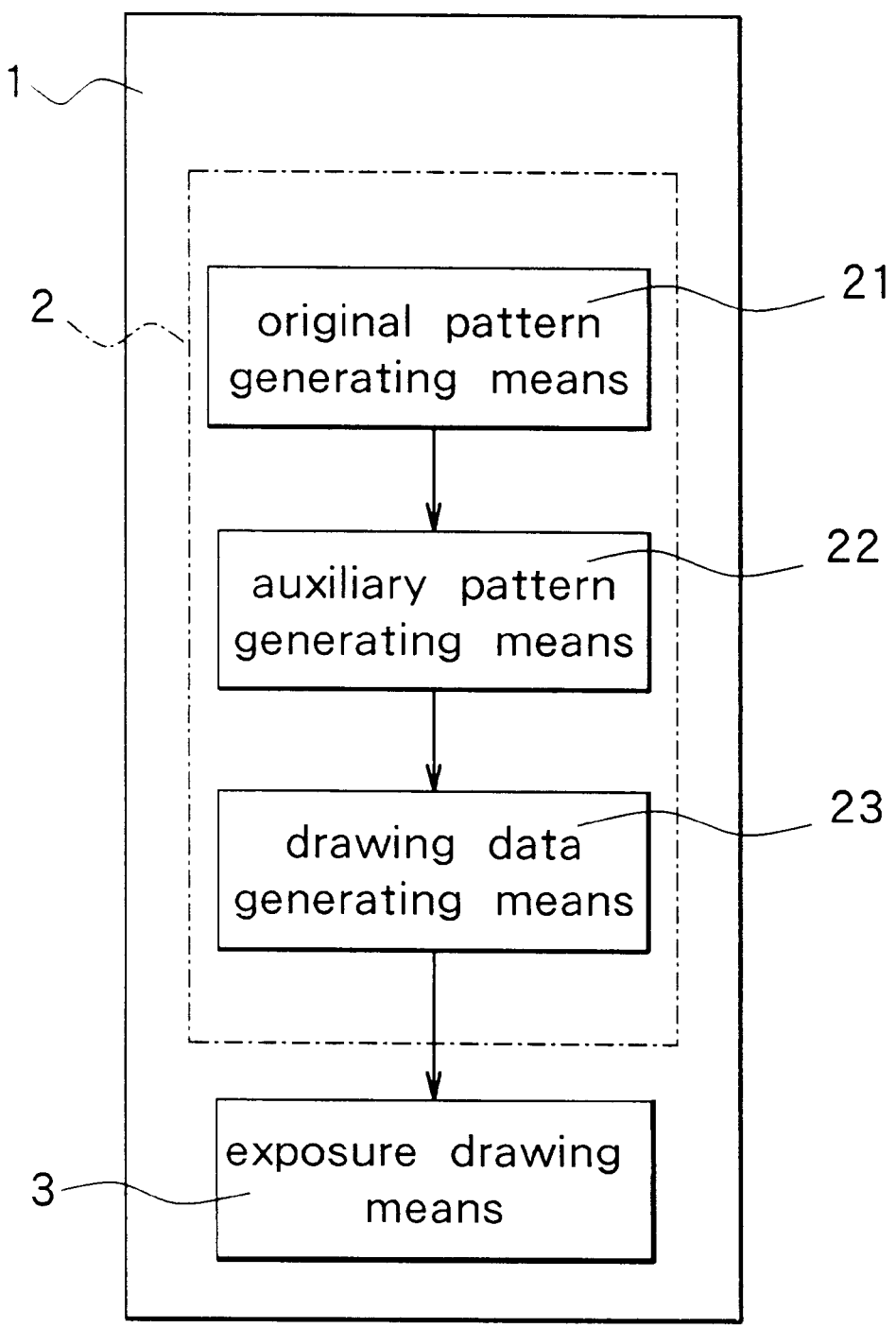
FIG. 6 is a block diagram of an apparatus for making a mask of an embodiment of the invention.

FIG. 6 is a block diagram of an apparatus for making a mask of the embodiment of the invention.

As shown in FIG. 6, a mask making apparatus 1 comprises a mask pattern generating section 2 for making a mask pattern and an exposure drawing means 3 such as an electron beam exposure system for drawing a mask pattern made at the mask pattern generating section 2 on a mask substrate.

The mask pattern generating section 2 comprises: an original pattern generating means 21 for making an original pattern such as a semiconductor integrated circuit pattern to be printed on a wafer substrate; an auxiliary pattern generating means 22 for making an auxiliary pattern for improving printing accuracy of the original pattern based on the original pattern made by the original pattern generating means 21 and for making a mask pattern including the auxiliary pattern; and a drawing data generating means 23 for transforming the mask pattern including the auxiliary pattern made by the auxiliary pattern generating means 22 into drawing data in a format suitable for the exposure drawing means 3 and outputting the data to the exposure drawing means 3. The mask pattern generating section 2 corresponds to an apparatus for making a mask pattern of the invention.

The original pattern generating means 21 may be made up of a computer aided design (CAD) system for making an original pattern. An original pattern thereby formed is transformed to a graphic data format such as GDS II (a trademark of Cadence System Inc.) and outputted to the auxiliary pattern generating means 22.

The auxiliary pattern generating means 22 is provided for forming an auxiliary pattern following steps described later for the original pattern transformed to a graphic data format such as GDS II so as to make a mask pattern. The mask pattern thus formed is outputted to the drawing data generating means 23. The auxiliary pattern generating means 22 may be made up of an apparatus such as a computer that operates in accordance with a program implementing the formation steps described later. In this case such a program may be either previously installed in an apparatus such as a computer or provided through a recording medium or a communication means. A mask pattern including an auxiliary pattern is thereby automatically fabricated by means of a computer and the like. The auxiliary pattern generating means 22 corresponds to a forbidden region establishing means and a formation region establishing means.

The writing data generating means 23 is provided for transforming the graphic data such as GDS II to a format of writing data specific to the exposure drawing means 3 such as an electron beam exposure system. The exposure drawing means 3 allows the mask pattern made by the auxiliary pattern generating means 22 to be formed on a specific mask substrate based on the drawing data thus transformed by the drawing data generating means 23.

The data format of the original pattern outputted from the original pattern generating means 21 to the auxiliary pattern generating means 22 may be data transformed to a format for drawing instead of graphic data such as GDS II. In this case the auxiliary pattern generating means 22 generates au auxiliary pattern based on the original pattern transformed to a format for drawing.

Figure 7:
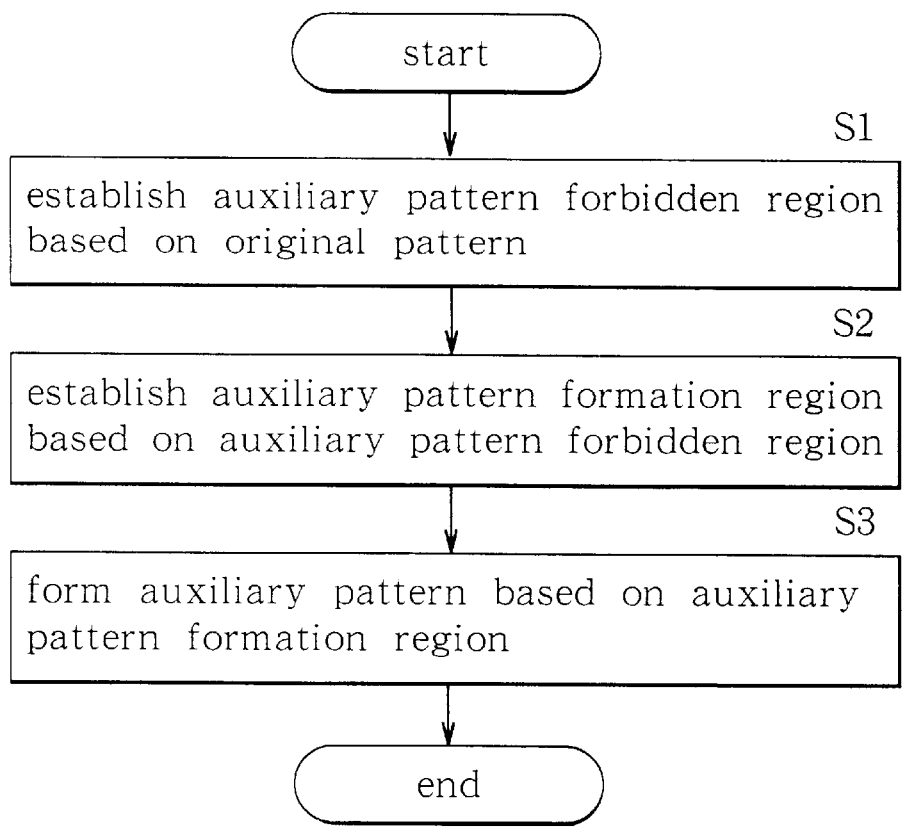
FIG. 7 is a flowchart of a method of making a mask pattern of the embodiment of the invention.

A method of making a mask pattern of the embodiment will now be described, mainly on steps of making an auxiliary pattern. FIG. 7 is a flowchart of the method of making a mask pattern of the embodiment of the invention, mainly showing the steps of making an auxiliary pattern. The auxiliary pattern making steps may be programmed for a computer and implemented by the auxiliary pattern generating means 22.

In the method of making a mask pattern of the embodiment as shown in FIG. 7, the auxiliary pattern making steps includes: a step of providing an auxiliary pattern forbidden region around an original pattern based on the original pattern formed by the original pattern generating means 21 (step S1); a step of providing an auxiliary pattern formation region around the auxiliary pattern forbidden region based on the auxiliary pattern forbidden region provided in step S1 (step S2); and a step of forming an auxiliary pattern of specific width based on the auxiliary pattern formation region provided in step S2 (step S3).

The steps of making an auxiliary pattern made up of step S1 to step S3 will now be described in detail with reference to FIG. 8 to FIG. 17.

Figure 8:
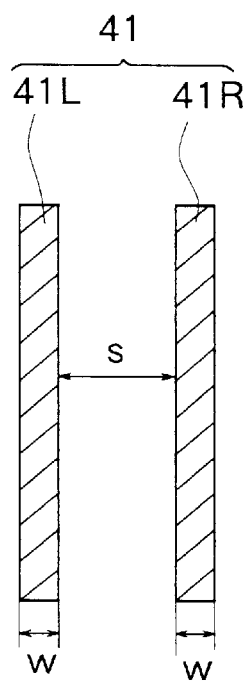
FIG. 8 illustrates an example of original pattern to which the method of making a mask pattern of the embodiment of the invention is applied.
Figure 9:
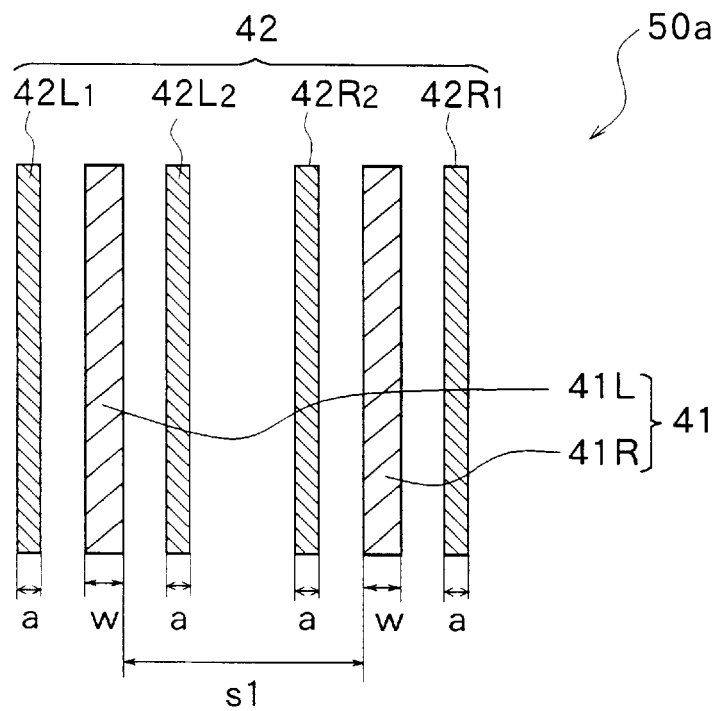
FIG. 9 illustrates an example of mask pattern formed in the embodiment of the invention.
Figure 10:
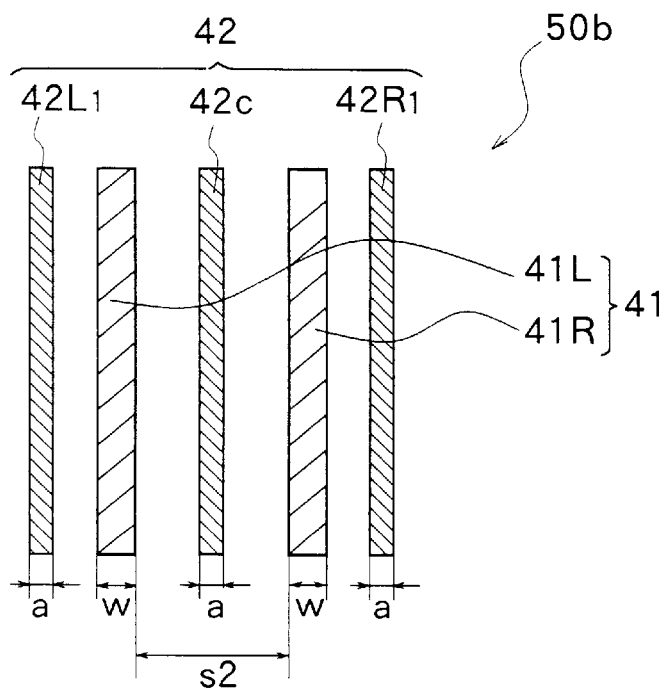
FIG. 10 illustrates another example of mask pattern formed in the embodiment of the invention.
Figure 11:
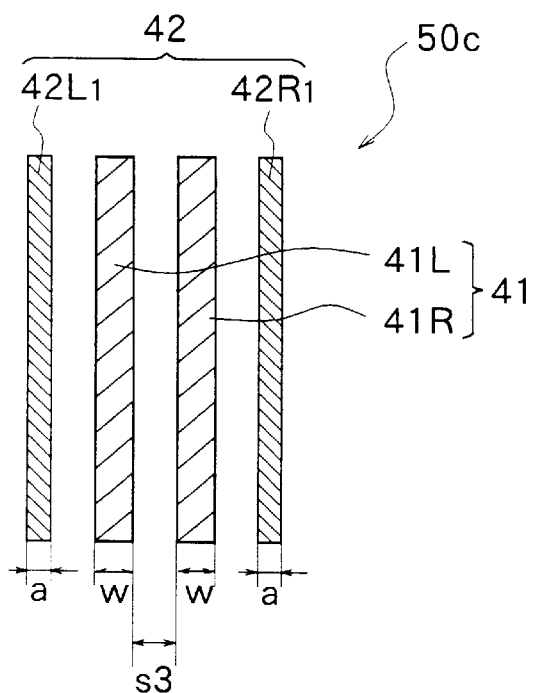
FIG. 11 illustrates still another example of mask pattern formed in the embodiment of the invention.

FIG. 8 shows an example of original pattern 41 made by the original pattern generating means 21. FIG. 9 to FIG. 11 show examples of mask patterns each including an auxiliary pattern formed based on the original pattern 41 in FIG. 8.

In the embodiment, as shown in FIG. 8, an auxiliary pattern is formed for the original pattern 41 made up of neighboring two straight lines 41L and 41R. The width of each of the lines 41L and 41R is 'w'. The interval between the lines 41L and 41R is 's'. For simplicity of description, an auxiliary pattern is formed only on sides of the lines 41L and 41R of the original pattern 41 in the embodiment and description of an auxiliary pattern provided on the top and bottom of the pattern 41 is omitted. In examples following the description of the embodiment, formation of an auxiliary pattern all around the original pattern including the top and bottom thereof will be specifically described.

In general, if an auxiliary pattern is formed to correspond to the neighboring two straight lines 41L and 41R as shown in FIG. 8, a mask pattern to be formed may be any of three types such as first to third mask patterns 50a to 50c shown in FIG. 9 to FIG. 11, respectively, depending on the length of interval 's'.

The first mask pattern 50a shown in FIG. 9 is formed when interval 's' is relatively long interval s1. An auxiliary pattern 42 including four auxiliary traces $42L_1$, $42L_2$, $42R_1$ and $42R_2$ is formed on sides of the two straight lines 41L and 41R. In this case, the two auxiliary traces $42L_2$ and $42R_2$ are placed side by side between the straight lines 41L and 41R.

The second mask pattern 50b shown in FIG. 10 is formed when interval 's' is interval s2 shorter than interval s1 in the first mask pattern 50a. The auxiliary pattern 42 including three auxiliary traces $42L_1$, $42R_1$ and 42c is formed on sides of the two straight lines 41L and 41R. In this case, the auxiliary trace 42c is only formed between the straight lines 41L and 41R.

The third mask pattern 50c shown in FIG. 11 is formed when interval 's' is interval s3 shorter than interval s2 in the second mask pattern 50b. The auxiliary pattern 42 including two auxiliary traces $42L_1$ and $42R_1$ is formed on sides of the two straight lines 41L and 41R. In this case, no auxiliary trace is formed between the straight lines 41L and 41R.

As described so far, if an auxiliary pattern is formed for the neighboring two straight lines 41L and 41R, a mask pattern to be formed may be any of the first to third mask patterns 50a to 50c shown in FIG. 9 to FIG. 11, respectively, depending on the length of interval 's'. In this case, the relationship between intervals s1 to s3 is represented by s1>s2>s3. The embodiment is applicable to formation of any of the first to third mask patterns 50a to 50c through the steps making the auxiliary pattern described below. It is thereby possible to form an auxiliary pattern for an original pattern having complicated traces, which is difficult in related art techniques. Specific conditions are provided for the values of interval s1 to s3 for making the first to third mask patterns 50a to 50c. Before describing the conditions, the steps of making the auxiliary pattern of the embodiment will be described, taking the first mask pattern 50a in FIG. 9 as an example.

Figure 12:
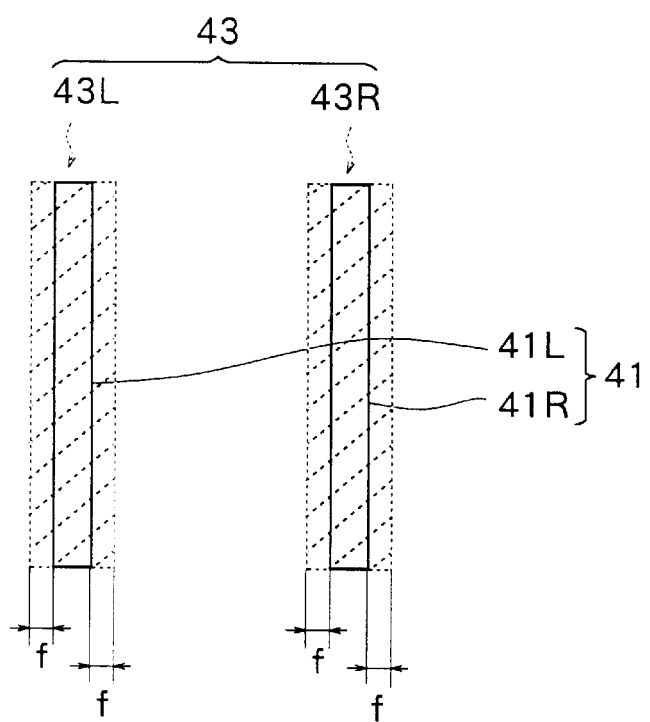
FIG. 12 illustrates a step of making the mask pattern shown in FIG. 9.
Figure 13:
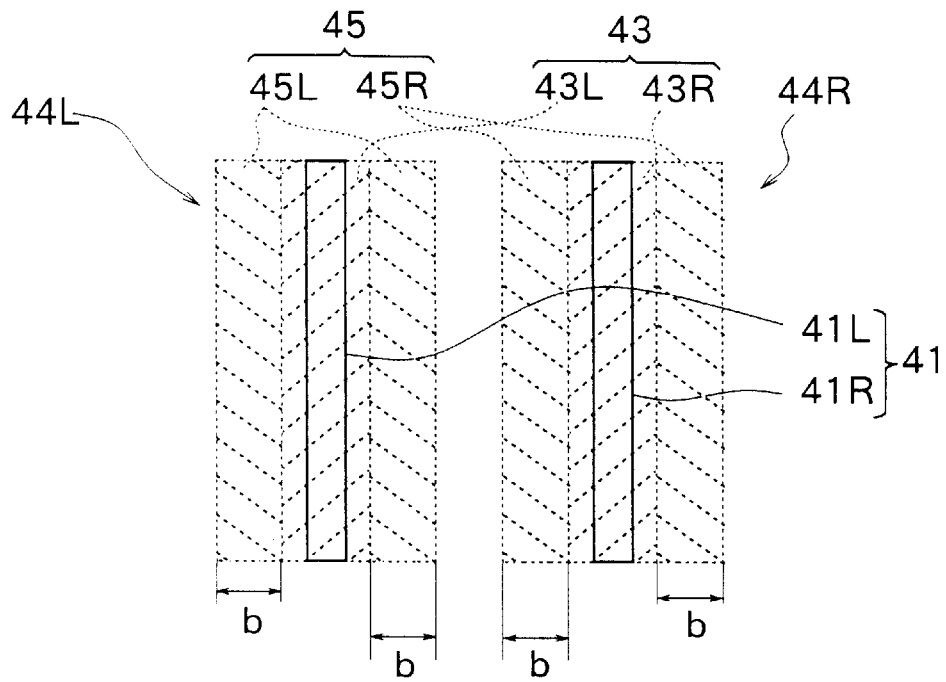
FIG. 13 illustrates a step to follow FIG. 12.
Figure 14:
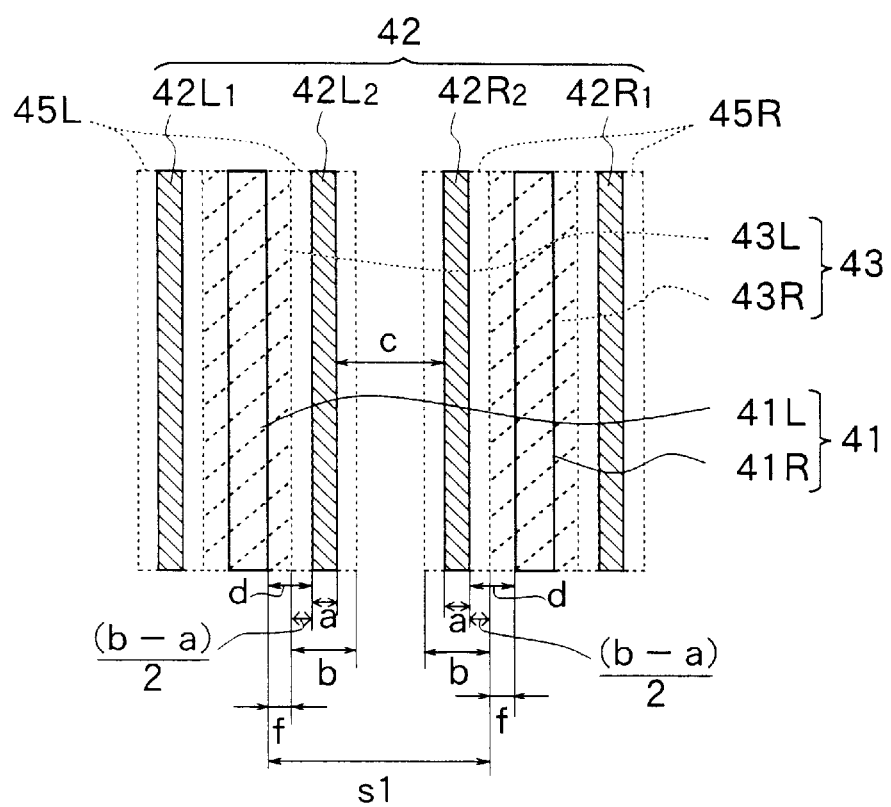
FIG. 14 illustrates a step to follow FIG. 13.

FIG. 12 to FIG. 14 illustrate the steps of making the first mask pattern 50a. The steps correspond to step S1 to step S3, respectively, of the flowchart shown in FIG. 7.

As shown in FIG. 12, width 'f' is provided on the periphery of each of the two straight lines 41L and 41R of the original pattern 41 made by the original pattern generating means 21. The original pattern 41 is thereby enlarged and two enlarged original pattern regions 43L and 43R are provided. The logical sum of the two enlarged original pattern regions 43L and 43R is established as an auxiliary pattern forbidden region 43 for forbidding generation of an auxiliary pattern. It is desirable that width 'f' for establishing the auxiliary pattern forbidden region 43 is closer to minimum width 'wm' of the original pattern formed on a mask. Specific conditions for the value of width 'f' will be described in detail later.

Next, as shown in FIG. 13, width 'b' is provided on the periphery of the auxiliary pattern forbidden region 43. The auxiliary pattern forbidden region 43 is thereby enlarged and two enlarged auxiliary pattern forbidden regions 44L and 44R are provided. The logical sum of the two enlarged auxiliary pattern forbidden regions 44L and 44R from which the auxiliary pattern forbidden region 43 is excluded is established as auxiliary pattern formation regions 45 (including regions $45L_1$, $45L_2$, $45R_1$ and $45R_2$) for making an auxiliary pattern. Specific conditions for the value of width 'b' will be described in detail later.

Next, as shown in FIG. 14, the auxiliary pattern formation regions 45 ($45L_1$, $45L_2$, $45R_1$ and $45R_2$) are each reduced as narrow as width 'a' so as to form the auxiliary pattern 42 including traces $42L_1$, $42L_2$, $42R_1$ and $42R_2$. Width 'a' of each trace of the auxiliary pattern 42 is of a value lower than the resolution limit of an exposure system such as a stepper used in a printing process so that the auxiliary pattern 42 will not be printed on a wafer substrate. The depth of focus of the original pattern 41 is thereby increased and printing accuracy is improved without printing the auxiliary pattern 42 on a wafer substrate. Interval 'd' between each trace of the auxiliary pattern 42 and each of the straight lines 41L and 41R is represented by d={f+(b−a)/2}, using intervals 'f', 'b' and 'a', as shown in FIG. 14. Using intervals 'f', 'b' and 'a', as shown in FIG. 14, interval 'c' between the neighboring two auxiliary traces $42L_2$ and $42R_2$ is represented by:

$$c=[s1-\{d+a\}\times 2]$$

$$c=[s1-\{f+(b-a)/2+a\}\times 2]$$

$$c=[s1-\{2f+b+a\}]$$

Figure 15:
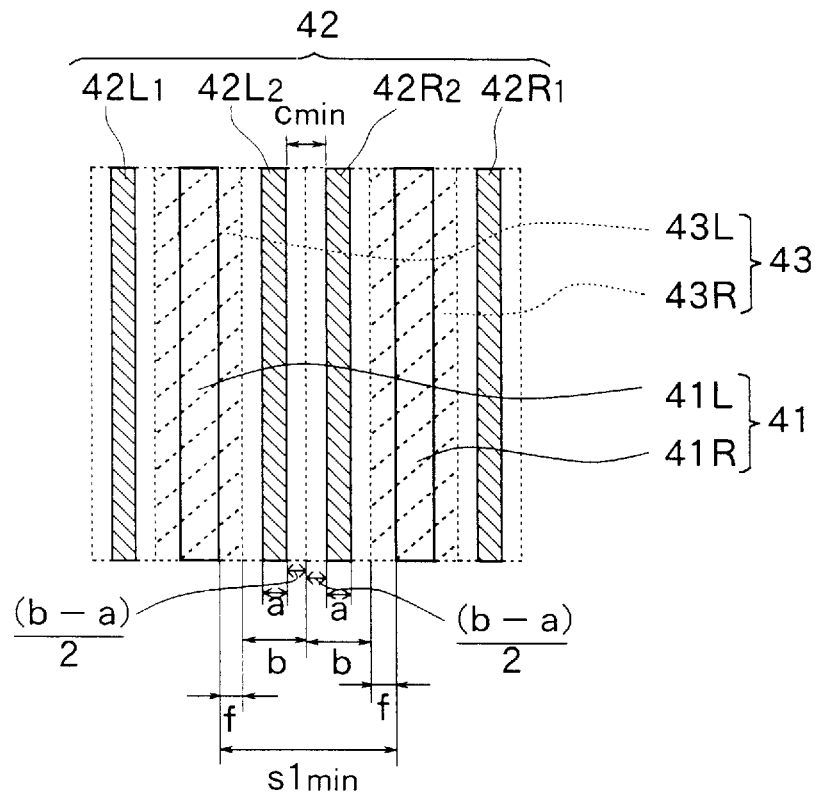
FIG. 15 illustrates another step of the method of making a mask pattern of the embodiment of the invention.

The auxiliary pattern 42 is formed through the steps described so far and the first mask pattern 50a shown in FIG. 9 is thereby formed. Reference is now made to FIG. 15 for describing the conditions for interval s1 in the first mask pattern 50a and the conditions and so on for widths 'b' and 'f' determined in each step.

As previously described, the neighboring two auxiliary traces $42L_2$ and $42R_2$ are formed between the straight lines 41L and 41R in the first mask pattern 50a. The conditions for determining interval s1 for the first mask pattern 50a may be defined as the conditions for forming the auxiliary traces $42L_2$ and $42R_2$ between the straight lines 41L and 41R. It is required that the auxiliary traces $42L_2$ and $42R_2$ are not too close to each other so that the auxiliary pattern 42 will not be printed on a wafer substrate in a printing process. That is, interval 'c' between the auxiliary traces $42L_2$ and $42R_2$ is equal to or above minimum width 'wm' of the original pattern on the mask. Interval 'c' is thus expressed by conditional expression (1) below.

$$c \geq wm \qquad (1)$$

FIG. 15 illustrates a step of making the mask pattern of the embodiment wherein interval 'c' is equal to minimum value 'cmin' when the auxiliary traces $42L_2$ and $42R_2$ are formed between the straight lines 41L and 41R. Interval 'c' is equal to minimum value 'cmin' when the auxiliary pattern formation regions $45L_2$ and $45R_2$ come to contact with each other. In this case, as shown in FIG. 15, cmin={(b−a)/2}×2=(b−a). Consequently, conditional expression (2) below is given from c≧cmin and expresion (1).

$$(b-a) \geq wm \qquad (2)$$

Conditional expression (3) is therefore given for width 'b' used for determining the auxiliary pattern formation region 45.

$$b \geq a+wm \qquad (3)$$

As is interval 'c', it is required that interval 'd' between each trace of the auxiliary pattern 42 and each of the straight line 41L and 41R is not too short. Conditional expression (4) is therefore given for interval 'd'.

$$d=\{f+(b-a)/2\}/2>wm \qquad (4)$$

Consequently, a relational expression of f>wm−(b−a)/2 holds. From the relational expression and expression (3), conditional expression (5) below is given for width 'f' for determining the auxiliary pattern forbidden region 43.

$$f>wm/2 \qquad (5)$$

It is thus required that width 'f' is greater than half of minimum width 'wm'. However, if width 'f' is too large, the auxiliary pattern forbidden region 43 is so large that it is impossible to form the auxiliary pattern 42. It is therefore preferable that width 'f' is 50 to 150 percent of minimum width 'wm'.

Interval 'c' is equal to minimum value 'cmin' when interval s1 is equal to minimum value 's1min'. As shown in FIG. 15, 's1min'=2 (f+b). Conditional expression (6) below is therefore given from s1≧s1min.

$$s1 \geq 2(f+b) \qquad (6)$$

Therefore, the condition for interval s1 for forming the first mask pattern 50a shown in FIG. 9 is that interval 's' between the straight lines 41L and 41R is s≧2(f+b). If interval 's' is lower, that is, s<2(f+b), the second mask pattern 50b in FIG. 10 or the third mask pattern 50c in FIG. 11 will be formed.

Figure 16:
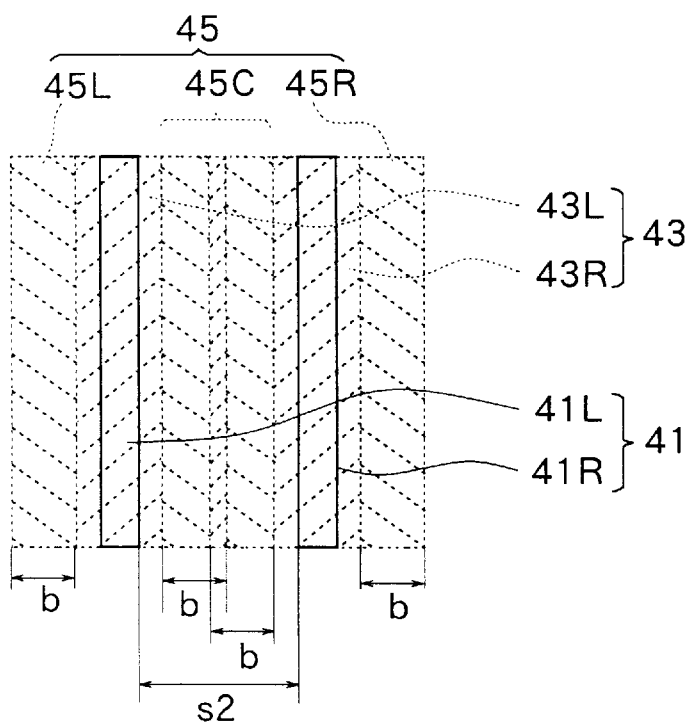
FIG. 16 illustrates a step of making the mask pattern shown in FIG. 10.
Figure 17:
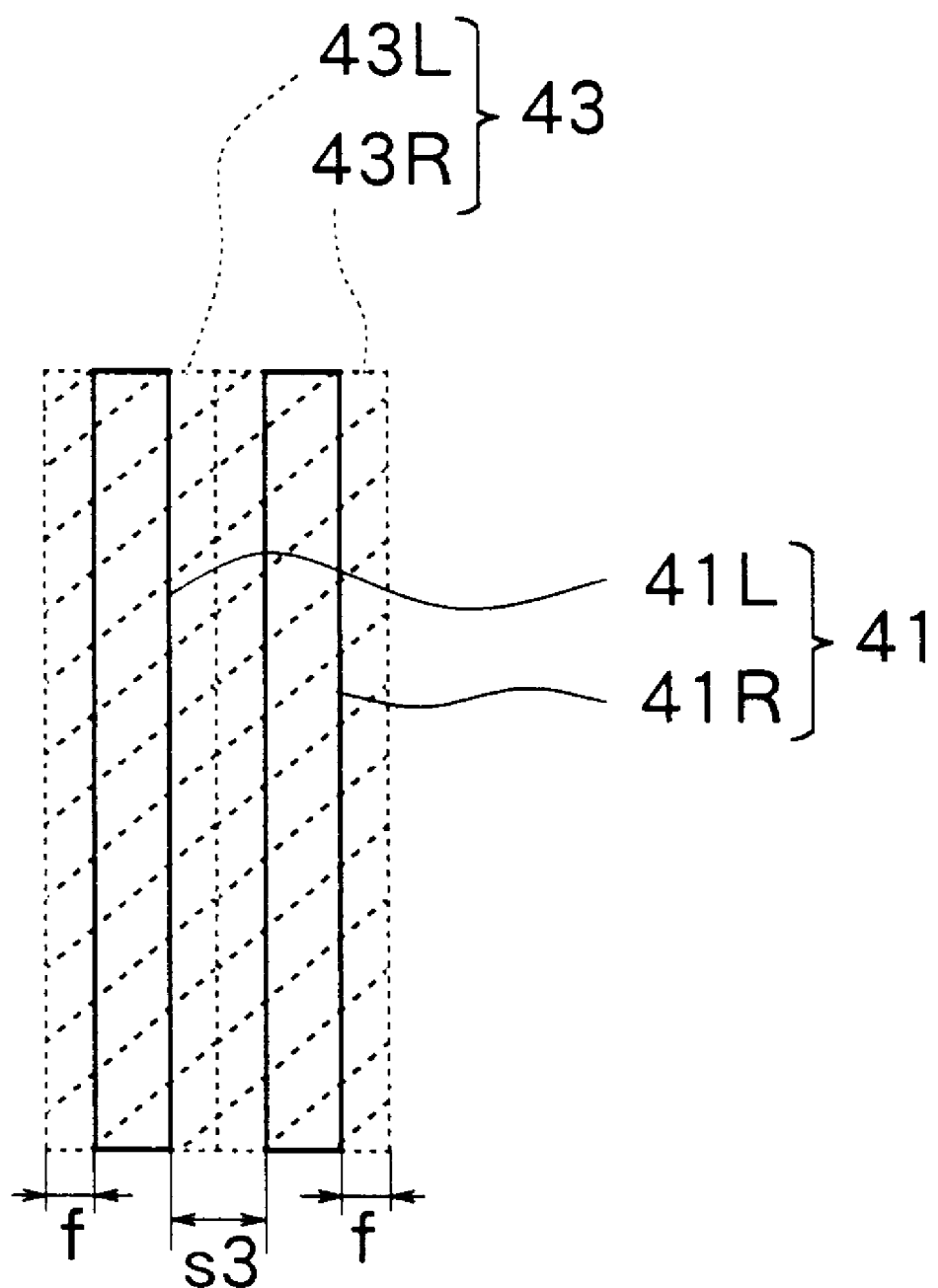
FIG. 17 illustrates a step of making the mask pattern shown in FIG. 11.

FIG. 16 illustrates a step of making the second mask pattern 50b in FIG. 10 wherein the auxiliary trace 42c is only formed between the straight lines 41L and 41R. FIG. 17 illustrates a step of making the third mask pattern 50c in FIG. 11 wherein no auxiliary pattern is formed between the straight lines 41L and 41R.

For forming the second mask pattern 50b as shown in FIG. 10, through steps similar to those of making the first mask pattern 50a, width 'b' is determined on the periphery of the auxiliary pattern forbidden region 43. The auxiliary pattern forbidden region 43 is thereby enlarged and the two enlarged auxiliary pattern forbidden regions 44L and 44R are provided. The logical sum of the enlarged auxiliary pattern forbidden regions 44L and 44R from which the auxiliary pattern forbidden region 43 is excluded is established as the auxiliary pattern formation regions 45 (including regions $45L_1$, 45c and $45R_2$). In this case, the region 45c is only formed between the straight lines 41L and 41R in contrast to the first mask pattern 50a. This is because the logical sum of the enlarged auxiliary pattern forbidden regions 44L and 44R is determined. Consequently, one auxiliary trace is only formed between the straight lines 41L and 41R.

Where the second mask pattern 50b shown in FIG. 10 is formed, it is required that the minimum value of interval s2 is at least greater than twice the value of width 'f' for determining the auxiliary pattern forbidden region 43. This is because, where s≦2f, as shown in FIG. 17, the auxiliary pattern forbidden region 43 occupies all the region between the neighboring straight lines 41L and 41R. Consequently, the auxiliary pattern formation region 45c is not provided inside the straight lines 41L and 41R. Therefore, conditional expression (7) below is given, together with the condition s<2(f+b) described above, for interval s2 for making the second mask pattern 50b. One auxiliary trace is only formed between the neighboring straight lines 41L and 41R where conditional expression (7) holds.

$$2f<s<2(f+b) \qquad (7)$$

Conditional expression (8) below is thus given for interval s3 where the third mask pattern 50c shown in FIG. 11 is formed. When conditional expression (8) holds, as in the case where the first mask pattern 50a in FIG. 9 is formed, width 'f' is provided on either side of the straight lines 41L and 41R and the auxiliary pattern forbidden region 43 is thereby determined. In this case, as shown in FIG. 17, the auxiliary pattern forbidden region 43 occupies all the region between the neighboring straight lines 41L and 41R. Therefore, no auxiliary line is formed between the straight lines 41L and 41R.

$$s \leq 2f \qquad (8)$$

In summary, the condition for interval s1 where the first mask pattern 50a shown in FIG. 9 is formed is that interval 's' between the straight lines 41L and 41R is represented by $s \geq 2(f+b)$ with width 'f' for determining the auxiliary pattern forbidden region 43 and width 'b' for determining the auxiliary pattern formation region 45. Interval 'd' between each trace of the auxiliary pattern 42 thereby formed and each of the straight lines 41L and 41R is represented by $d=\{f+(b-a)/2\}$ where width of each trace of the auxiliary pattern 42 is 'a'. The auxiliary pattern 42 including the traces $42L_1$, $42L_2$, $42R_1$ and $42R_2$ is formed on both sides of the straight lines 41L and 41R with interval 'd'. As previously described, width 'f' for determining the auxiliary pattern forbidden region 43 is the value that satisfies f>wm/2 where 'wm' is the minimum width of the original pattern formed on a mask. For example, width 'f' is 50 to 150 percent of minimum width 'wm'. Width 'a' of each trace of the auxiliary pattern 42 is the value lower than the resolution limit of an exposure system such as a stepper. Width 'b' for determining the auxiliary pattern formation region 45 is the value that satisfies $b \geq a+wm$. It is possible that the values of 'f', 'a' and 'b' are each determined as initial values before formation of the auxiliary pattern 42.

The condition for interval s2 where the second mask pattern 50b shown in FIG. 105 is formed is that interval 's' between the straight lines 41L and 41R is 2f<s<2(f+b). The single auxiliary trace 42c is formed between the neighboring two straight lines 41L and 41R. The interval between the auxiliary trace 42c and each of the straight lines 41L and 41R is (s−a)/2.

The condition for interval s3 where the third mask pattern 50c shown in FIG. 11 is formed is that interval 's' between the straight lines 41L and 41R is $s \leq 2f$ which is equal to or smaller than width 'f' for determining the auxiliary pattern forbidden region 43. No auxiliary pattern is formed between the straight lines 41L and 41R.

In the embodiment as described so far, the auxiliary pattern forbidden region 43 is provided around the original pattern 41 before forming the auxiliary pattern 42. Consequently, the auxiliary pattern 42 is not formed too close to the original pattern 41. Furthermore, the auxiliary pattern formation regions 45 are provided around the auxiliary pattern forbidden region 43. Each trace of the auxiliary pattern 42 is formed by reducing each of the auxiliary pattern formation regions 45 to width 'a'. As a result, if a plurality of traces of the auxiliary pattern 42 are formed, neighboring traces will not come too close to each other.

Such formation of the auxiliary pattern 42 prevents the neighboring straight lines 41L and 41R from touching or overlapping each other, for example.

In addition, the steps of making the auxiliary pattern 42 may be programmed for automated processing with an apparatus such as a computer. As a result, a mask pattern including the auxiliary pattern 42 is easily fabricated at high speed even if the original pattern 41 is a complicated one such as a pattern for semiconductor integrated circuit. With a mask on which such a mask pattern is written, the original pattern 41 has a pseudo dense pattern and depth of focus is thereby increased in a printing process. Printing accuracy is thus improved.

Specific examples of the invention will now be described in detail with reference to the drawings. In the following description, most part of configuration, operations and effects is similar to those of the mask making apparatus 1. Like numerals are assigned to components similar to those of the mask making apparatus 1 and description thereof is omitted.

FIRST EXAMPLE

A first example of the invention will now be described.

FIG. 18 to FIG. 22 illustrate steps of making a mask pattern of this example.

Figure 18:
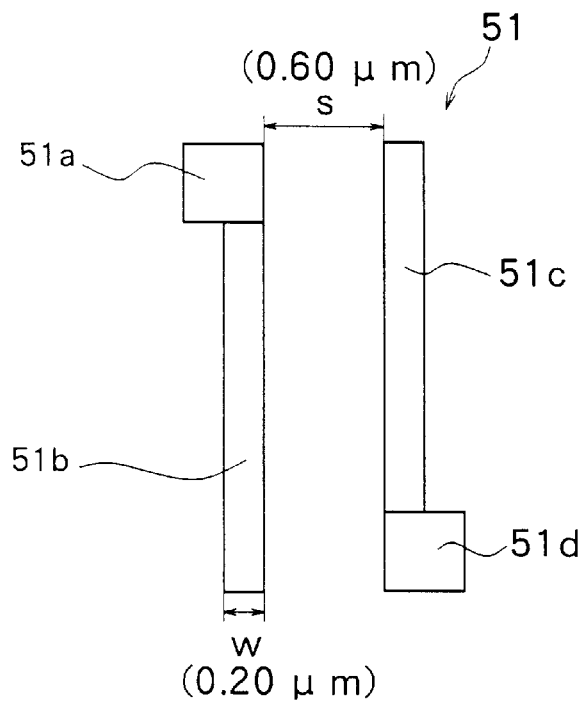
FIG. 18 illustrates an original pattern of a first example of the invention.

FIG. 18 illustrates an original pattern of the example. As shown, an auxiliary pattern is formed for an original pattern 51 made up of first to fourth divided FIGS. 51a, 51b, 51c and 51d. The second FIG. 51b and the third FIG. 51c each have a nearly rectangular shape, placed with the shorter side at the top. The first FIG. 51a and the fourth FIG. 51d each have a nearly square shape. A side of each of the second FIG. 51b and the third FIG. 51c touches a side of the first FIG. 51a and the fourth FIG. 51d, respectively. Therefore, the original pattern 51 has a configuration wherein two pairs of figures are placed side by side, one of the pairs being the first FIG. 51a and the second FIG. 51b and the other being the third FIG. 51c and the fourth FIG. 51d. In the example, width 'w' of each of the second FIG. 51b and the third FIG. 51c is of the order of 0.20 µm. Interval 's' is of the order of 0.60 µm between the pair made up of the first FIG. 51a and the second FIG. 51b and the pair made up of the third FIG. 51c and the fourth FIG. 51d.

Figure 19:
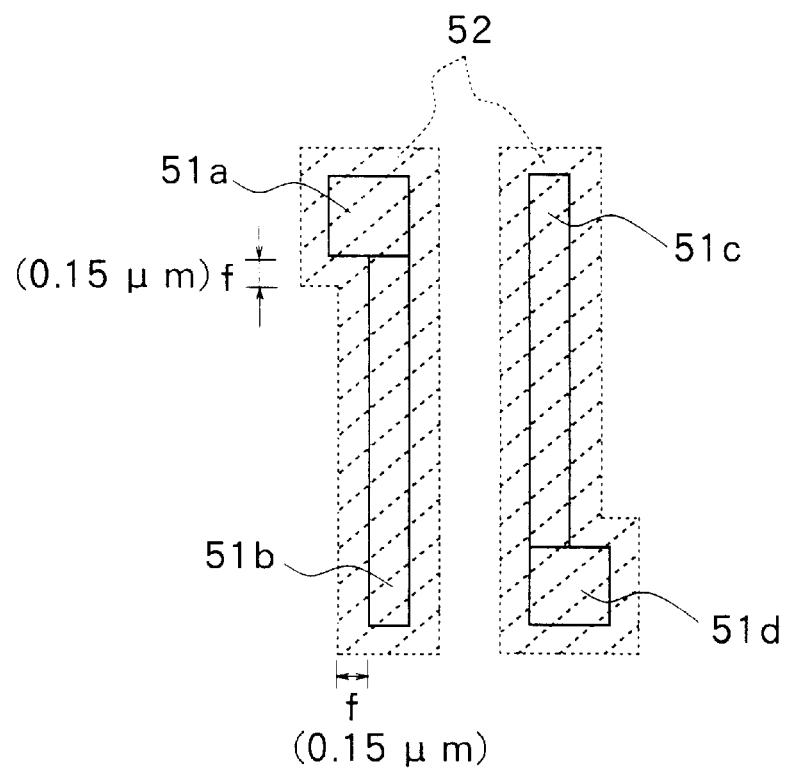
FIG. 19 illustrates a step of a method of making a mask pattern of the first example of the invention.

In order to form an auxiliary pattern for the original pattern 51 with such a configuration, as shown in FIG. 19, width 'f' is determined on the periphery of each of the first FIG. 51a to the fourth FIG. 51d. A plurality of enlarged original pattern regions are thereby determined. Furthermore, the logical sum of the enlarged original pattern regions is determined as an auxiliary pattern forbidden regions 52. Width 'f' for determining the auxiliary pattern forbidden regions 52 is 0.15 µm, for example.

Figure 20:
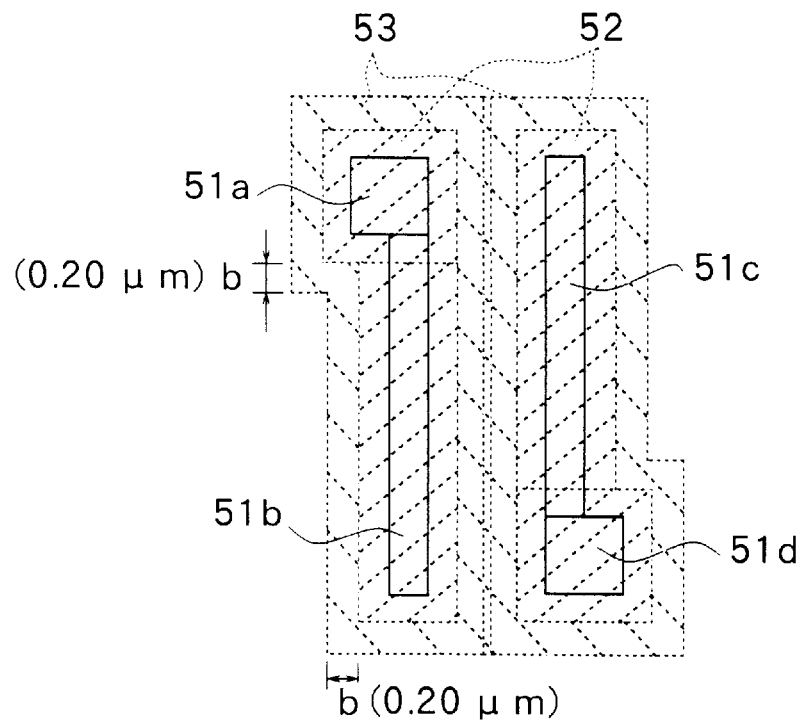
FIG. 20 illustrates a step to follow FIG. 19.

Next, as shown in FIG. 20, width 'b' is determined on the periphery of the auxiliary pattern forbidden regions 52 so as to determine a plurality of enlarged forbidden regions. The logical sum of the enlarged forbidden regions from which the auxiliary pattern forbidden regions 52 is excluded is established as auxiliary pattern formation regions 53. Width 'b' is 0.20 µm, for example.

Figure 21:
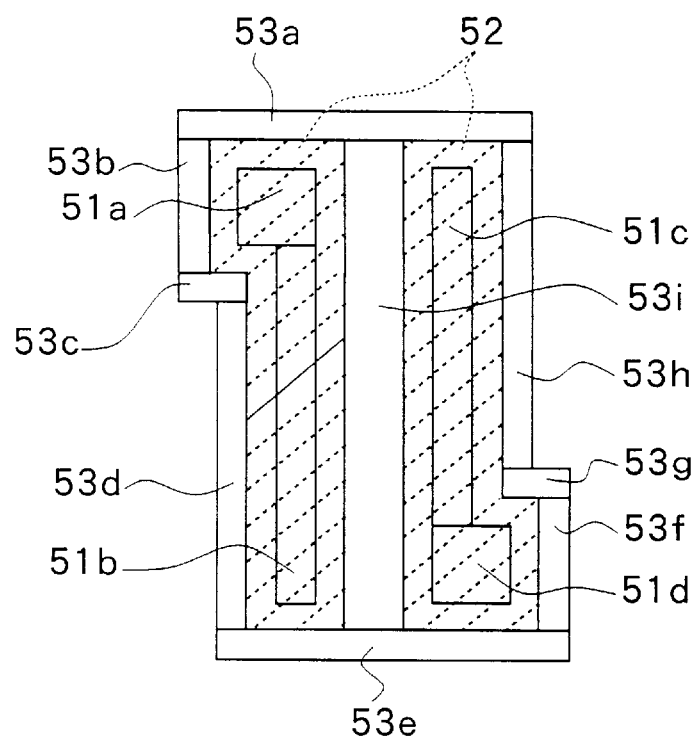
FIG. 21 illustrates a step to follow FIG. 20.

Next, as shown in FIG. 21, the auxiliary pattern formation regions 53 are divided into nine regions of first formation region 53a to ninth formation region 53i.

Figure 22:
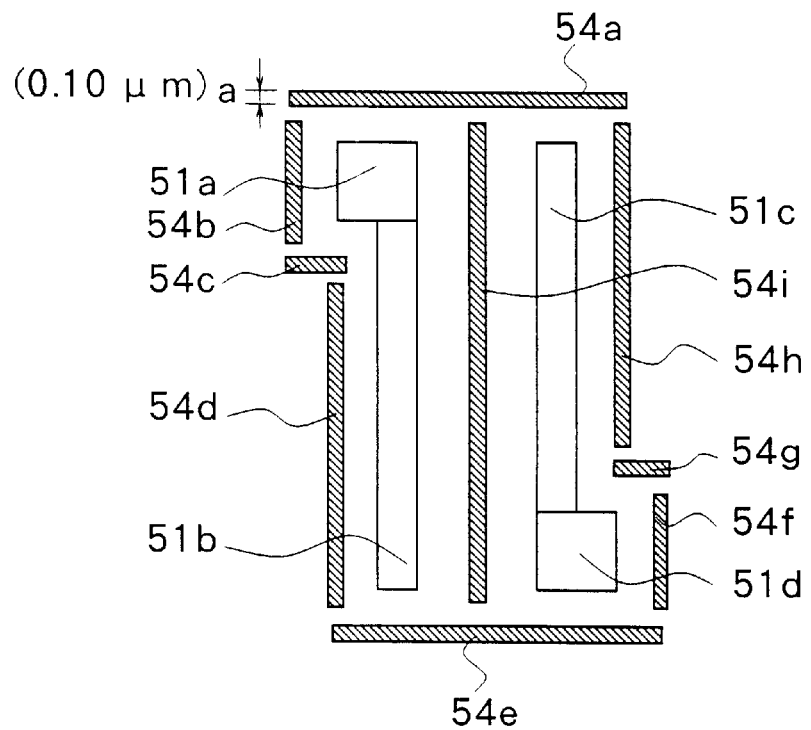
FIG. 22 illustrates a step to follow FIG. 21.

Finally, as shown in FIG. 22, the first formation region 53a to the ninth formation region 53i are each reduced to width 'a' so as to form nine auxiliary traces 54a to 54i. Width 'a' is of the order of 0.10 µm so that the auxiliary traces 54a to 54i will not be printed on a wafer substrate.

As thus described, the nine divided auxiliary traces 54a to 54i are formed for the original pattern 51 made up of the divided figures including the first FIG. 51a to the fourth FIG. 51d. The mask pattern including the auxiliary traces 54a to 54i thus formed is transformed into drawing data by the drawing data generating means 23 and drawn on a mask substrate by the exposure drawing means 3 so as to form a mask. Using the mask, the mask pattern is printed on a resist on a wafer substrate in an exposure system such as a KrF excimer laser stepper. The original pattern 51 including a fine trace of 0.20 μm is satisfactorily printed on the wafer substrate.

In the example as described so far, the auxiliary pattern formation regions 53 are divided into the nine regions 53a to 53i and the auxiliary traces 54a to 54i are formed for the original pattern 51 made up of the plurality of FIGS. 51a to 51d. In addition to the effects described in the foregoing embodiment, the auxiliary traces 54a to 54i are formed for the complicated original pattern 51 more efficiently and more minutely.

SECOND EXAMPLE

Figure 23:
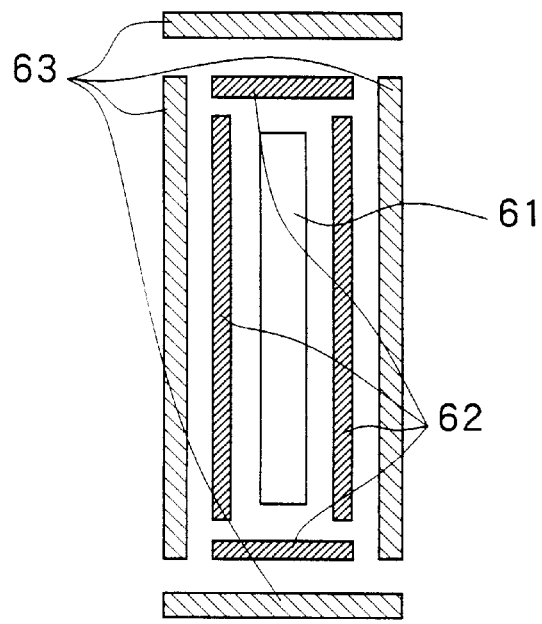
FIG. 23 illustrates a mask pattern formed in a second example of the invention.

A second example of the invention will now be described. FIG. 23 shows an example of mask pattern formed in the second example.

As shown, in the mask pattern formed in the example, auxiliary patterns 62 and 63 are formed in two steps for a completely isolated original pattern 61 wherein no other pattern near the original pattern 61 touches the original pattern 61.

In this case, in a method similar to that of the first example above, the first auxiliary pattern 62 is first formed. Next, the first auxiliary pattern 62 is regarded as another original pattern. The second auxiliary pattern 63 is then formed on the periphery of the first auxiliary pattern 62 regarded as the other original pattern in a method similar to that of the first example. The auxiliary patterns 62 and 63 are thus formed in the two steps for the original pattern 61.

In the example as thus described, the auxiliary patterns 62 and 63 are formed in the two steps for the completely isolated original pattern 61. In addition to the effects described in the foregoing embodiment, repeatability of a mask pattern is further increased and depth of focus in a process of printing on a wafer substrate is further increased. Printing accuracy is therefore significantly improved.

THIRD EXAMPLE

Figure 24:
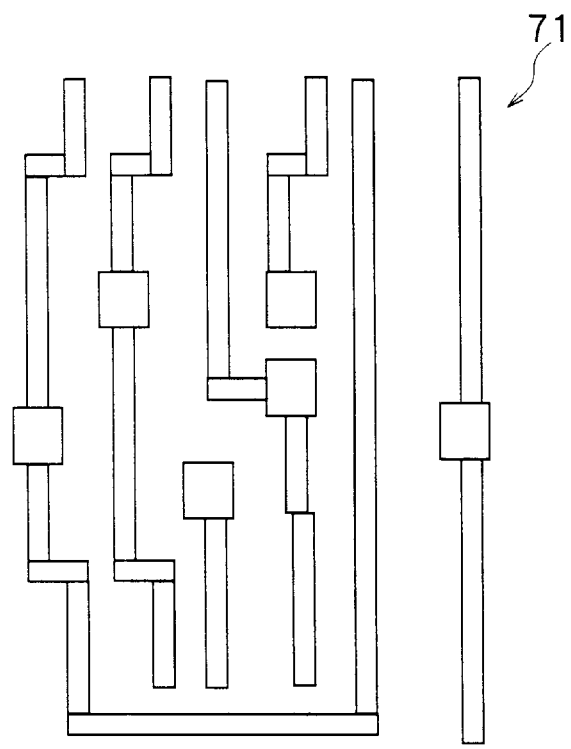
FIG. 24 illustrates an original pattern of a third example of the invention.
Figure 25:
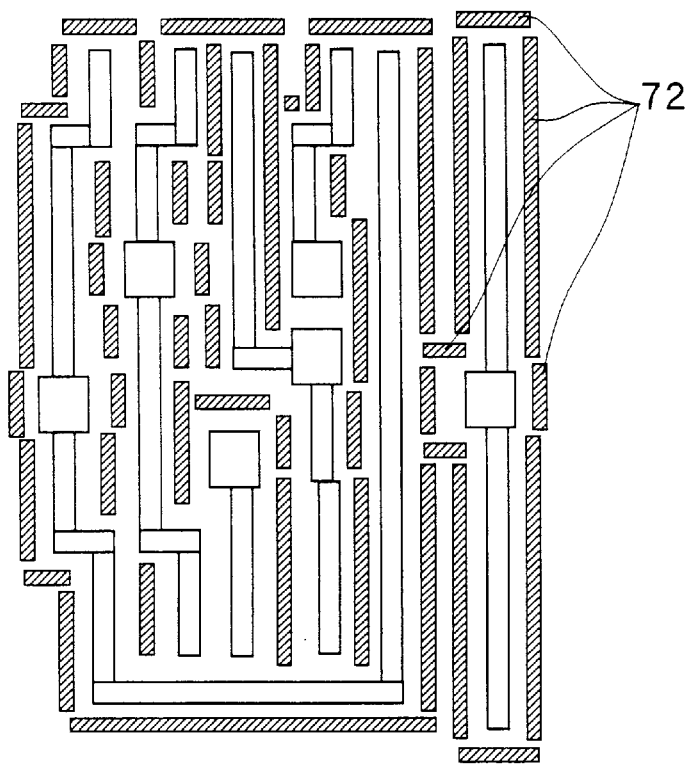
FIG. 25 illustrates an example of mask pattern formed in the third example of the invention.

A third example of the invention will now be described. FIG. 24 shows an original pattern in the example. FIG. 25 shows an example of mask pattern formed in the example.

In the example, as shown in FIG. 24, a mask pattern including an auxiliary pattern for increasing depth of focus where an original pattern is a gate pattern 71 for a logic gate of a semiconductor integrated circuit. The gate pattern 71 has a configuration wherein a plurality of original patterns 51 and 61 described in the first and second examples are combined. Therefore, methods similar to those of the first and second examples are employed for making a mask pattern including auxiliary pattern 72 as shown in FIG. 25. A mask on which the mask pattern is written is thus fabricated.

In the example the mask pattern including the auxiliary pattern 72 is formed, using the methods similar to those of the first and second examples. In addition to the effects described in the foregoing embodiment, the auxiliary pattern 72 is efficiently formed for the gate pattern 71 for the complicated logic gate. The mask pattern including the auxiliary pattern 72 is thus easily formed.

The invention is not limited to the embodiment and examples described so far but may be practiced in still other ways. For example, although the original pattern in the third example is the gate pattern 71 for a logic gate, the invention allows a mask pattern including an auxiliary pattern to be easily formed for an original pattern of wiring of a logic device.

The invention may be applied to formation of gates and wiring of a semiconductor device wherein both logic and memory are provided. In this case, an auxiliary pattern is provided for a sparse pattern so that the pattern is a pseudo dense pattern. In a printing process, not only depth of focus is increased but also variations of dimensions due to difference in pattern density is reduced. Furthermore, an auxiliary pattern is formed on edges of a memory cell having a repeated pattern as well. Degradation of the memory cell edge is thereby reduced.

In the method of making a mask pattern or the apparatus for making a mask pattern of the invention as described so far, the auxiliary pattern forbidden region is formed and the auxiliary pattern formation region is established before formation of the auxiliary pattern. As a result, neighboring two traces of the auxiliary pattern are prevented from touching or overlapping each other, for example. The auxiliary pattern for increasing depth of focus which improves printing accuracy of the original pattern is easily formed even if the original pattern is a complicated one without repeatability. The mask pattern including the auxiliary pattern is thereby easily fabricated. With a mask on which such a mask pattern is drawn, fine pattern formation is satisfactorily achieved all over a wafer substrate. As a result, semiconductor devices such as a high-performance logic device and a device including both logic and memory are easily manufactured.

The method of making a mask pattern may include the step of transforming the mask pattern including the auxiliary pattern into drawing data for a drawing apparatus. As a result, the mask pattern including the auxiliary pattern for increasing depth of focus is easily drawn on a mask substrate with a drawing apparatus.

In the apparatus for making a mask of the invention, the auxiliary pattern is made through formation of the auxiliary pattern forbidden region and the auxiliary pattern formation region. The mask pattern including the auxiliary pattern thus formed is drawn on a mask substrate so as to form a mask. As a result, the mask pattern including the auxiliary pattern for increasing depth of focus is easily formed even if the original pattern is a complicated one without repeatability. The mask on which such a mask pattern is drawn is easily fabricated at high speed. With such a mask, fine pattern formation is satisfactorily achieved all over a wafer substrate. As a result, semiconductor devices such as a high-performance logic device and a device including both logic and memory are easily manufactured.

Obviously many modifications and variations of the present invention are possible in the light of the above teachings. It is therefore to be understood that within the scope of the appended claims the invention may be practiced otherwise than as specifically described.

What is claimed is:

1. A method of making a mask pattern including an original pattern to be printed on a wafer substrate and an auxiliary pattern for improving printing accuracy of the original pattern, including the steps of:

forming the original pattern to be printed on the wafer substrate, said original pattern having a minimum width (w);

providing a first specific width (f) that has a span close to said minimum width (w) on the entire periphery of the original pattern and enlarging the original pattern so as to form an enlarged original pattern region and establishing the enlarged original pattern region as an auxiliary pattern forbidden region wherein formation of the auxiliary pattern is forbidden;

providing a second specific width (b) on the entire periphery of the auxiliary pattern forbidden region and thereby enlarging the auxiliary pattern forbidden region so as to form an enlarged forbidden region and establishing the enlarged forbidden region from which the auxiliary pattern forbidden region is excluded as an auxiliary pattern formation region for forming the auxiliary pattern; and reducing the auxiliary pattern formation region to a third specific width (a) within which the auxiliary pattern is formed, wherein an interval (d) between the auxiliary pattern and the original pattern is represented by: $d=\{f+(b-a)/2\}$.

2. A method of making a mask pattern according to claim 1, further including the step of transforming the mask pattern including the original pattern and the auxiliary pattern into drawing data for a drawing apparatus.

3. A method of making a mask pattern according to claim 1, wherein in the step of establishing the auxiliary pattern forbidden region, if the original pattern is a plurality of divided figures, a specific width is provided on the periphery of each of the plurality of divided figures so as to determine a plurality of enlarged original pattern regions and a logical sum of the plurality of enlarged original pattern regions is established as the auxiliary pattern forbidden region.

4. A method of making a mask pattern according to claim 1, wherein in the step of establishing the auxiliary pattern formation region, if the auxiliary pattern forbidden region is a plurality of divided figures, a specific width is provided on the periphery of each of the plurality of divided figures so as to determine a plurality of enlarged forbidden regions and a logical sum of the plurality of enlarged forbidden regions from which the auxiliary pattern forbidden region is excluded is established as a plurality of auxiliary pattern formation regions.

5. A method of making a mask pattern according to claim 1, wherein the auxiliary pattern formation region is a plurality of divided figures, and each of the figures is reduced to a specific width so as to form the auxiliary pattern.

6. A method of making a mask pattern according to claim 1, wherein in the step of establishing the auxiliary pattern forbidden region, the specific width (f) provided for establishing the auxiliary pattern forbidden region is a value of 50 to 150 percent of said minimum width (w) of the original pattern.

7. A method of making a mask pattern according to claim 1, wherein the width (a) of said auxiliary pattern is sufficiently small so that a laser beam or electron beam can pass through said width, yet without allowing the auxiliary pattern to be printed on the wafer substrate.

8. A method of making a mask pattern according to claim 1, wherein in the step of forming the auxiliary pattern, if the auxiliary pattern includes a plurality of traces, the auxiliary pattern is formed such that an interval (c) between neighboring two of the traces is greater than said minimum width (w) of the original pattern.

9. A method of making a mask pattern according to claim 8, wherein the original pattern is a plurality of divided figures, and two of said divided figures are separated by an interval (s), and said interval (c) is represented by the following equations:

$$c=(s-\{d+a\}\times 2)$$

$$c=(s-\{f+(b-a)/2+a56\times 2)$$

$$c=(s-\{2f+b+a\}).$$

* * * * *

UNITED STATES PATENT AND TRADEMARK OFFICE
CERTIFICATE OF CORRECTION

PATENT NO. : 6,074,787
DATED : June 13, 2000
INVENTOR(S) : Koichi Takeuchi

It is certified that error appears in the above-identified patent and that said Letters Patent is hereby corrected as shown below:

Column 14, line 36, claim 9 line 9, the second equation should read;

$$C = (s - \{f + (b - a) / 2 + a\} \times 2)$$

Signed and Sealed this

Eighth Day of May, 2001

*Attest:*

NICHOLAS P. GODICI

*Attesting Officer*  Acting Director of the United States Patent and Trademark Office